United States Patent [19]

Rioux

[11] 4,024,596
[45] May 24, 1977

[54] APPARATUS FOR CLEANING SLICES OF MATERIAL

[75] Inventor: Philip Joseph Rioux, Glendale, Ark.

[73] Assignee: Motorola, Inc., Chicago, Ill.

[22] Filed: Nov. 5, 1975

[21] Appl. No.: 628,860

[52] U.S. Cl. .................................. 15/21 D; 15/77; 15/102; 51/88; 134/6

[51] Int. Cl.² ...................... A46B 13/02; B08B 7/00

[58] Field of Search ..................... 15/21 D, 77, 102; 134/6, 9; 51/88

[56] References Cited

UNITED STATES PATENTS

| | | | |
|---|---|---|---|
| 1,261,688 | 4/1918 | Bratherton | 274/47 |
| 2,311,481 | 2/1943 | Sinclair | 274/47 |
| 2,980,935 | 4/1961 | Bogard et al. | 134/6 |
| 3,150,401 | 9/1964 | Taylor et al. | 274/47 |
| 3,473,181 | 10/1969 | Leonard | 15/77 |
| 3,585,668 | 6/1971 | Jaccodine et al. | 15/21 D |
| 3,748,677 | 7/1973 | Frank et al. | 15/21 D |
| 3,970,471 | 7/1976 | Bankes et al. | 134/6 |

Primary Examiner—Steven L. Stephan
Attorney, Agent, or Firm—Lowell E. Clark

[57] ABSTRACT

Both sides of thin slices of material are cleaned simultaneously in the apparatus of this invention. A slice of material rotates about its axis as it passes between opposed rotatable cleaning surfaces. The apparatus includes a stop which maintains the slice of material off-center with respect to the cleaning surfaces. The apparatus is particularly useful for cleaning slices of semiconductor material.

12 Claims, 4 Drawing Figures

APPARATUS FOR CLEANING SLICES OF MATERIAL

BACKGROUND OF THE INVENTION

This invention relates to an apparatus for cleaning slices of material. More particularly, the invention relates to an apparatus for simultaneously cleaning both sides of a semiconductor wafer.

In the field of semiconductor manufacturing, it is necessary at certain stages to clean the semiconductor material. Thus, thin slices, generally referred to as wafers, of semiconductor material which have been cut from bulk material often have residual particulate matter and lubricants on their surfaces which must be removed prior to polishing. Furthermore, after polishing, and at other intervals in the process of making devices from the wafers, it is often necessary to carry out a cleaning operation. Since these wafers are quite thin, generally of 10 to 20 thousandths of an inch, and are quite brittle, their fragility presents a problem in designing suitable cleaning apparatus.

Various apparatus for cleaning semiconductor wafers have been disclosed in the prior art. For example, U.S. Pat. No. 3,585,668, described an apparatus which holds the wafers on a flat surface and cleans one side of the wafers at a time. However, since it is often desired to clean both sides of the wafer, such an apparatus requires two separate steps for cleaning each wafer.

One solution to the problem of cleaning both sides of a semiconductor wafer is disclosed in U.S. Pat. No. 3,748,677 which describes an apparatus having a special disk which rotates vertically in a bath. A disadvantage of such a unit is that the wafers fall out after cleaning into a "cushioning bath" and then into a slice container, and the apparatus must be stopped in order to remove wafers therefrom. Furthermore, the removal step requires handling of the wafers which is a recognized disadvantage in wafer processing.

SUMMARY OF THE INVENTION

It is an object of this invention to provide an apparatus for simultaneously cleaning both sides of a slice of material.

It is a further object of this invention to provide an apparatus which minimizes handling of the cleaned slices.

It is still another object of this invention to provide an apparatus which cleans a slice of material and makes it readily available for immediate processing at another station.

According to this invention, a slice of material is cleaned between opposed rotatable cleaning surfaces in an apparatus which further includes stop means for maintaining the slice off-center with respect to the cleaning surfaces.

DETAILED DESCRIPTION OF THE INVENTION

Figure 1:
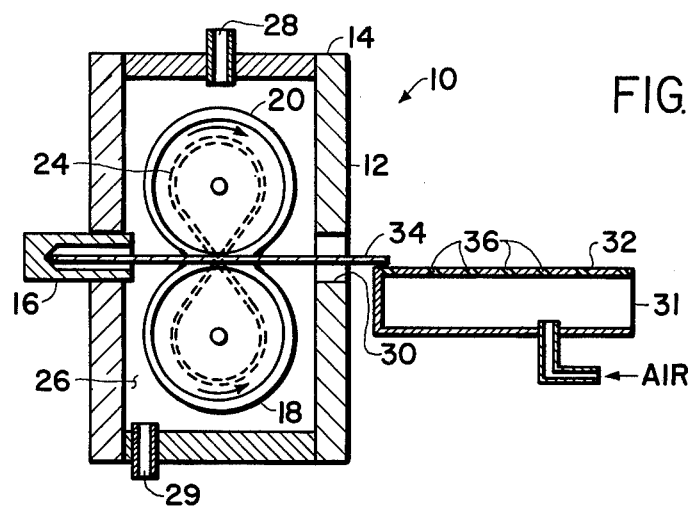
FIG. 1 is a front elevational view partly in section of one embodiment of the apparatus of the invention.
Figure 2:
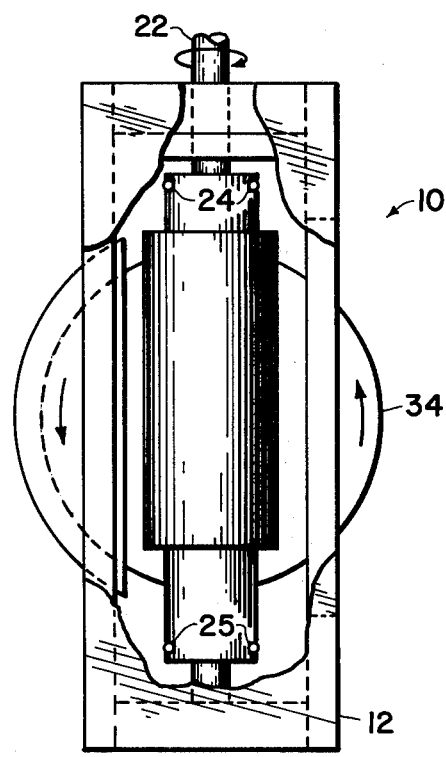
FIG. 2 is a plan view, partly in section, of the apparatus of FIG. 1.

Referring to FIGS. 1 and 2, there is shown an apparatus generally designated as 10. Housing 12 has a removable cover 14 and both housing and cover are preferably made of plexiglass or any appropriate plastic or metal. Disposed in housing 12 is a stop 16 which can conveniently be made of a plastic such as polytetraflouroethylene. However it will be appreciated that any suitable material can be employed for this stop, the function of which will be described in detail hereinafter. The stop preferably has a portion which corresponds to the shape and size of the slice of material to be cleaned. Thus, a semiannular shaped stop having the same circumference as the circumference of the wafer to be cleaned is depicted in the drawings. Cleaning surfaces 18 and 20 are disposed in opposing positions within housing 12, and are preferably adjustable within the housing. These cleaning surfaces are mounted on a reversible drive shaft 22 which is connected to a motor (not shown). Drive O-rings 24 and 25 function to cause the cleaning surfaces to move in opposing directions with respect to each other. It should be understood that any suitable means for driving the cleaning surfaces in the desired directions can be employed, and that the apparatus is not limited to the means shown in the drawings. For example, separate motors could be used to drive each cleaning surface, eliminating the O-ring, or gears could be employed. Housing 12 also contains cleaning solution 26, inlets 28 and 29, and solution overflow 30. Adjacent to the apparatus are means for feeding a wafer thereto, shown as air bearing unit 31.

In order to illustrate more fully the operation of this apparatus, a typical cleaning procedure will be described. An apparatus similar to that described in the drawings was fitted with nylon covered paint rollers, each roller having a length of 2 inches, interior diameter 2 inches, and a ⅜ inch nap. The rollers were mounted to contact opposing surfaces of a three inch diameter silicon semiconductor wafer 34. A cleaning solution 26 comprising water and a biodegradable liquid soap was employed, the liquid soap was added at inlet 28 and water at inlet 29. However, the means of adding the cleaning solution is not critical. For example, it could be sprayed from sprayheads in the housing. The rollers were rotated at 35 rpm until both rollers were wetted with the cleaning solution. It has been found that rotations from 0 to 500 rpm are suitable with variable speeds preferred. Then wafer 34 was moved along belt 32 by means of air jets 36 supplied by a conventional source. While air jets are shown for purposes of illustration, any suitable wafer handling track can be employed. As the wafer reaches the nip between rollers 18 and 20, it is caught and pulled between the rollers.

It is another critical feature of this invention that the outside diameter of the rollers be from about 50% to about 100%, and preferably from about 60% to about 85% of the diameter of the wafer. From the previously reported dimensions, it is apparent that in this example, the outside diameter of the rollers was 66-⅔% of the diameter of the wafer. This sizing results in the frictional forces being higher on the outer parts of the wafer than in the center, and causes the wafer to spin or rotate about its axis as it moves between rotating rollers 18 and 20, thus cleaning all the surfaces thereof. Furthermore stop 16 is positioned to maintain the wafer off-center from the rollers, that is, the center of the wafer is never aligned with the center of the rollers. This feature also contributes to the spinning of the wafer. After the wafer has been cleaned, the direction of rollers 18 and 20 is reversed, thus causing the wafer to be discharged from the apparatus at the approximate position where it first was engaged by the rollers. By reversing the direction of the air jets, the wafer is carried away on belt 32 to the next processing station where it is rinsed and dried.

Figure 3:
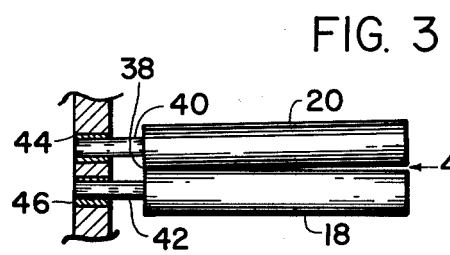
FIG. 3 is a side view of the rotatable cleaning surfaces employed in this invention, positioned in accordance with one embodiment thereof.

FIG. 3 shows a preferred arrangement for rollers 18 and 20, which results in a non-parallel cleaning axis alignment. In this embodiment the spacing between the rollers varies from about 20 to about 40 thousandths of an inch from end 38 to end 40. This arrangement increases the friction on the edges of the wafer, enhancing the spinning action as it passes through the rollers. Furthermore, while this arrangement can be employed in the apparatus of FIGS. 1 and 2, it is still more preferred to cantilever the rollers as illustrated in FIG. 3, for example using shafts 40 and 42 and air bearings 44 and 46. Again, this arrangement functions to enhance the spinning action of the wafer.

The apparatus depicted in the drawings can be modified in the practice of this invention. For example, brushes or any other type of cleaning means can be employed instead of the rollers shown above. Materials of various sizes and shapes can be cleaned, assuming a stop having the configuration and size of the material to be cleaned is used. Of course, the dimensions of the housing are not critical, although preferably they are designed to accommodate the size of material to be cleaned. Also, the apparatus can be used as a separate entity, or as a module in an automatic semiconductor processing unit.

Figure 4:
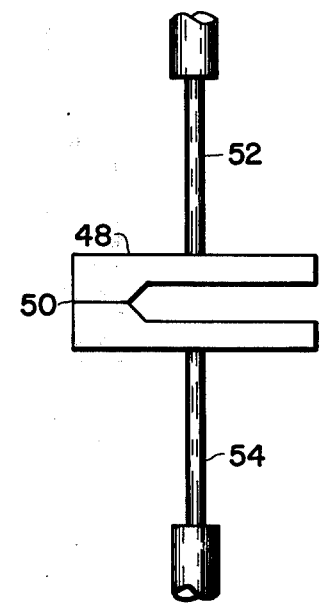
FIG. 4 is a front elevational view of part of the apparatus including stop means according to another embodiment of the invention.

In FIG. 4, stop 48 includes gate means represented by making the stop in two separate pieces which meet at line 50 when assembled in the housing. The pieces are secured to movable shafts 52 and 54 which slide up and down in housing 12. By separating stop 48, the cleaned wafer can be discharged from the apparatus through the stop, obviating the need for reversing the direction of rotation of the rollers. While FIG. 4 depicts a horizontal break in the stop, a vertical break or any other means permitting release of the wafer can be used.

It should be emphasized that the cleaning can be carried out at any step in the process. Furthermore, the apparatus is not limited to cleaning but can be used to rinse materials. While the invention has been illustrated with respect to cleaning wafers of semiconductor material, it is not intended that it be limited thereto. Thus, any thin material which should be cleaned on both sides can be so cleaned utilizing the apparatus of this invention.

Although the invention has been described in connection with certain preferred embodiments, it is not intended that the invention be limited thereto. Thus, it is intended that the invention cover all alternatives, arrangements, equivalents, and embodiments as may be included in the scope of the following claims.

What is claimed is:

1. Apparatus for cleaning a slice of material comprising:
    opposed rotatable cleaning surfaces for engaging opposite faces of the slice and for rotating said slice; and
    stop means engaging the periphery of said slice so that at least one of said surfaces engages said slice at a face portion comprising one but not both extremities of a chord the slice off-center with respect to said opposed rotatable cleaning surfaces.

2. The apparatus of claim 1 further including means for moving the slice into engagement with said cleaning surfaces.

3. The apparatus of claim 2 wherein said means for moving the slice is located at a first position on one side of said opposed rotatable cleaning surfaces, and said stop means is located at a second position on the opposite side of said opposed rotatable cleaning surfaces.

4. The apparatus of claim 3 wherein said stop means comprises a member having a shaped portion corresponding to the configuration of a portion of the perimeter of said slice, said shaped portion being adapted to engage said slice.

5. The apparatus of claim 4 wherein said stop means comprises segments separable to permit said slice to be discharged from said apparatus through said stop means.

6. The apparatus of claim 4 wherein said stop means is designed for engagement with a circular slice, and said shaped portion has a circumference corresponding to the circumference of the slice.

7. The apparatus of claim 4 further including a housing surrounding at least a portion of one of said opposed rotatable cleaning surfaces and forming a support for said stop means.

8. The apparatus of claim 7 wherein said housing includes means for applying a cleaning solution to the area of engagement of the cleaning surfaces with the slice.

9. The apparatus of claim 1 wherein said opposed rotatable cleaning surfaces comprise cylindrical members.

10. The apparatus of claim 9 wherein said cylindrical members are positioned to have coplanar but non-parallel axes with respect to each other.

11. The apparatus of claim 9 wherein said cylindrical members are cantilevered.

12. A method for cleaning a slice of material which comprises:
    passing said slice between opposed cylindrical cleaning members rotating in directions opposite to each other; and
    maintaining said slice so that at least one of said rotating members engages said slice at a face portion comprising one but not both extremities of a chord.

* * * * *